(12) United States Patent
Adir et al.

(10) Patent No.: US 7,133,816 B2
(45) Date of Patent: Nov. 7, 2006

(54) TEST QUALITY THROUGH RESOURCE REALLOCATION

(75) Inventors: Allon Adir, Tivon (IL); Eitan Marcus, Haifa (IL); Michal Rimon, Nofit (IL); Amir Voskoboynik, Misgav (IL)

(73) Assignee: International Business Machines Corporation, Armonk, NY (US)

( * ) Notice: Subject to any disclaimer, the term of this patent is extended or adjusted under 35 U.S.C. 154(b) by 682 days.

(21) Appl. No.: 10/287,860

(22) Filed: Nov. 4, 2002

(65) Prior Publication Data
US 2004/0088600 A1 May 6, 2004

(51) Int. Cl.
G06F 17/50 (2006.01)
G06F 9/45 (2006.01)

(52) U.S. Cl. .............................. 703/14; 703/15; 716/4; 716/5

(58) Field of Classification Search ................. 703/14; 716/5; 717/124–135, 151, 158; 712/227
See application file for complete search history.

(56) References Cited

U.S. PATENT DOCUMENTS 5,928,334 A * 7/1999 Mandyam et al. .......... 709/248
6,006,028 A * 12/1999 Aharon et al. ................ 703/21

OTHER PUBLICATIONS

Chandra et al., AVPGEN-A Test Generator for Architecture Verification, IEEE Transactions on VLSI Systems, vol. 3, No. 2, Jun. 1995, pp. 188-200.*

Jantsch et al., "Functional Validation of Mixed Hardware/Software Systems based on Specification, Partitioning, and Simulation of Test Cases", Design Automation of Embedded Systems, vol. 5, No. 1, Kluwer Academic Publisher, Feb. 2000, pp. 1-34.*
Geist et al., A Methodology for the Verification of a System On A Chip, DAC 99, New Orleans, Louisiana, 1999 ACM 1-58113-109-7/99/06. pp. 1-6.*
"Model-Based Test Generation for Processor Verification," Y. Lichtenstein, Y. Malka, A. Aharon, Sixth Innovative Applications of Artificial Intelligence Conference, Aug. 1994, (12 pages).
"AVPGEN—A Test Generator for Architecture Verification," A. Chandra, et al., IEEE Transactions on Very Large Scale Integration (VLSI) Systems, vol. 3, No. 2, Jun. 1995, pp. 188-200.
"MPTG: A Portable Test Generator for Cache-Coherent Multiprocessors", International Conference on Computers and Communications, 0-7803-2492-Jul. 1995, IEEE, pp. 38-44.
"Short Vs. Long—Size Does Make a Difference," A. Hartman, S. Ur, and A. Ziv, in IEEE International High Level Design Validation and Test Workshop (HLDVT), 1999 (6 pages).
"Test Program Generation for Functional Verification of PowerPC Processors in IBM," A. Aharon, D. Goodman, M. Levinger, Y. Lichtenstein, Y. Malka, C. Metzger, M. Molcho, and G. Shurek, in 32nd Design Automation Conference, 1995 (7 pages).

(Continued)

*Primary Examiner*—Paul Rodriguez
*Assistant Examiner*—Juan Ochoa
(74) *Attorney, Agent, or Firm*—Stephen C. Kaufman

(57) ABSTRACT

A preemptive reloading technique is employed in a test program generator. Initialized resources are reset with needed values by reloading instructions. The actual reloaded value is chosen later, when the instruction that actually needs the value is generated. The test program generator distances the reloading instruction from the instruction that actually needs the value, thus making it possible to avoid fixed test patterns and to generate interference-free test segments during design verification.

40 Claims, 5 Drawing Sheets

OTHER PUBLICATIONS

"A Methodology for the Verification of a 'System On A Chip'," D. Geist, G.Biran, T. Arons, M. Slavkin, Y. Nustov, M. Farkas, K. Holtz, A. Long, D. King, and S. Barret, in 36th Design Automation Conference 1999, New Orleans, Louisiana, (6 pages).

* cited by examiner

| Data: | Instructions: |
|---|---|
| ⋮<br>M[2000]  7<br>M[2004] -13<br>⋮<br>⋮ | instructions that put-7 in R2 and 13 in R5<br>⋮<br>⋮<br>I{Load M[2000]→R1}  ⟵46<br>I{Load M[2004]→R4}  ⟵48<br>⋮<br><br>I{Add R1+R2→R3}  //result is zero ⟵50<br>I{Add R4+R5→R6}  //result is zero ⟵52 |

| Data: | Instructions: |
|---|---|
| ⋮ | instructions that put -7 in R2 and 13 in R5 |
| M[2000]  7 | ⋮ |
| M[2004] -13 | I{Load M[2000]→R1} ~46 |
|  | I{Load M[2004]→R4} ~48 |
|  | I{Load M[2000]→R9} ~86 |
| ⋮ | ⋮ |
|  | I{Add R1+R2 → R3}  //result is zero ~50 |
|  | I{Add R4+R5 → R6}  //result is zero ~52 |

```
56 — Load-Word M[1000]→R4
58 — Map(M[1000-1003], R4)
90 — | {STORE  9→M[1000]}
60 — Add instruction giving a result of zero
```
~88

FIG. 8

```
94 — Load-Word M[1000]→GPR4
96 — Move-To GPR4→SPR7
100 — Xor GPR4, GPR4→GPR4
98 — Map(M[1000-1003], SPR7)
```
~92

FIG. 9

```
104 — Set_Immediate 0→R4         106
108 — Map(M[Program-Counter+2], R4)
                    110
```
~102

TEST QUALITY THROUGH RESOURCE REALLOCATION

BACKGROUND OF THE INVENTION

1. Field of the Invention

This invention relates generally to design verification, and more particularly to verification of a processor architecture of a computer system.

2. Description of the Related Art

An important aspect of designing an advanced computer processor is the ability to test the design of the processor thoroughly, in order to assure that the design complies with desired architectural, performance and design specifications. One known verification technique requires the generation of a large number of instruction sequences to assure that the processor behave properly under a wide variety of circumstances.

Test program generators are basically sophisticated software engines, which are used to create numerous test cases. By appropriate configuration, it is possible for test generation to be focused on very specific ranges of conditions, or broadened to cover a wide range of logic. Today, large numbers of test cases can be created automatically in the time that a single test case could be written manually, as was done prior to the advent of test case generators. Modern test program generators are sophisticated enough to evaluate the microarchitectural implementation of a processor.

Typically, the input to the test program generator is a user-defined sequence of partially specified instructions, known as an instruction stream, which acts as a template for the test to be generated. The instruction stream is generally incomplete, in that various details of each instruction, such as the specific source and the target resources to be used, the data values of each uninitialized resource, and even the exact instruction to be generated, may be left unspecified. The test program generator then generates a complete test by filling in the missing information with random values. The choice of random values is often biased, so as to increase the likelihood of detecting a design flaw. The use of templates in this manner allows the creation of numerous test cases that stress the implementation of the logic, creating various conditions such as "buffer full", or "pipe stall".

An example of a conventional test program generator is the IBM tool, Genesys, which is disclosed in the document *Model-Based Test Generation for Process Design Verification*, Y. Lichtenstein et. al., Sixth Innovative Applications of Artificial Intelligence Conference, August 1994, pp. 83–94. An updated version, of Genesys, known as Genesys-Pro, is a generic random test generator, targeted at the architectural level and applicable to any architecture.

Another conventional test program generator, AVPGEN, is disclosed in the document *AVPGEN—A Generator for Architecture Verification Test Cases*, A. Chandra, et al., IEEE Trans. Very Large Scale Integration (VLSI) Syst. 3, No. 2, pp. 188–200 (June 1995).

Still another test generator is disclosed in the publication B. O'Krafka, et al., "*MPTG: A Portable Test Generator for Cache-Coherent Multiprocessors*", International Conference on Computers and Communications, 1995, pp. 38–44. This generator is capable of generating tests that include scenarios with unpredictable results and relies on checks carried out for intermediate points in the test.

Test program generation typically involves the resolution of constraints to make the tests legal and interesting for verification. This is often achieved through the values of resources that are used by the instructions in the test. A difficulty is that the number of available resources is limited, and there may be fewer available resources than needed values, especially in long tests.

Commonly, the process of generating an instruction in a test includes the selection of the resources used by the instruction and the initialization of any uninitialized resource with some desired value. Constraints may also be placed on the value of instruction resources. Some of these constraints are imposed by the definition of the instruction itself, while others may have been requested by the user. The value contained in a resource significantly impacts the ability of the generator to satisfy these constraints, and as a result, the quality or legality of the test generated.

All processors contain resource families bounded in the number of elements they contain. For example, a processor may have only 32 floating point registers. Once a resource is initialized, its value is determined solely by instructions that cause its modification. After all the registers in the family have been used, generating any instruction that requires an element from this family becomes harder because the selection of data for the resources is restricted to their current values. These restricted values often prevent certain constraints from being satisfied when generating a new instruction. As a result, either the instruction generation fails or the generated instruction does not achieve its intended verification purpose. The problem becomes more acute when long tests need to be generated. Long tests are required to reach complex microarchitectural states, e.g., states in which there is high utilization of resources. Long tests are also desirable in order to test uncommon paths between states. Advantages of long tests are suggested in the document Short vs. Long: Size Does Make a Difference, A. Hartman, S. Ur, and A. Ziv, in IEEE International High Level Design Validation and Test Workshop (HLDVT), 1999. Long tests are shown to give better coverage of events that occur randomly, i.e., with no explicit intention of the generator, with a smaller total number of instructions than are used for a similar set of short tests.

Previous approaches to solving the problem of resource limitations are typified by the Genesys Test-Program generator described in the document *Test Program Generation for Functional Verification of PowerPC Processors in IBM*, A. Aharon, D. Goodman, M. Levinger, Y. Lichtenstein, Y. Malka, C. Metzger, M. Molcho, and G. Shurek, in 32nd Design Automation Conference, pages 279–285, 1995, and by the Sysgen Test-Program generator referred to by the document *A Methodology for the Verification of a 'System On A Chip'*, D. Geist, G. Biran, T. Arons, M. Slavkin, Y. Nustov, M. Farkas, K. Holtz, A. Long, D. King, and S. Barret, in 36th Design Automation Conference, pages 574–579, 1999. There it is proposed to inject unsolicited instructions into the test for the sole purpose of loading new values into a resource. These are called reloading instructions. In Genesys, when the generator generates an instruction that turns out to need some value in a register, then the generator generates the extra reloading instruction so as to immediately precede the client instruction. Sysgen solves the problem by generating fixed instruction stream patterns that include all the required reloading instructions followed by the client instructions. The major drawback to these approaches is that such interposed instructions interfere with the test. Indeed, the interference can spoil the scenario that the test was originally designed to check. In addition in the above mentioned two approaches interference caused by reloading instructions typically occurs in a fixed pattern.

Other possible approaches to obtain many values from a limited resource in the same test program may be considered. One of these involves the introduction of planning into the test generation process. For example, while generating an early instruction, the generator can look ahead in order to know what values would be needed later on. This knowledge can be regarded as an induced constraint, and can be taken into consideration at the time the early instruction is generated. Another possibility is to treat the entire test as a single problem of constraint satisfaction, and to coordinate all the values used and produced by all the instructions. The problem with both of these approaches is that the constraint problem becomes very large. In addition, the individual constraints themselves can be difficult to express and to solve, since they may be induced from intricate instruction semantics. Test generators that generate tests one instruction at a time, or one section at a time, as well as test generators that make use of planning are known to employ reloading techniques. However, conventional reloading approaches inject reloading instructions immediately before the client instruction, which causes interference, fixed instruction stream patterns and results in the neglect of many test patterns that could expose design flaws.

SUMMARY OF THE INVENTION

It is a primary advantage of some aspects of the present invention that many interesting tests for verification of a design are generated in systems in which there are too few resources to supply all values needed for the tests.

It is another advantage of some aspects of the present invention that reloading techniques are used in test generation, while minimizing interference caused by reloading instructions, and avoiding fixed code patterns in connection with the reloading instructions.

It is a further advantage of some aspects of the present invention that test segments employing interesting reloaded values can be generated with no reloading interference inside the segment.

It is yet another advantage of some aspects of the present invention that the number of unsolicited reloading instructions that are injected into the test program is reduced.

These and other advantages of the present invention are attained by a reloading technique employed by a test generator, referred to herein as "preemptive reloading", in which reloading instructions are distanced from the instructions that use the reloaded resource values. As in previous approaches, initialized resources are reset with the needed values by reloading instructions in the test. However, in embodiments of the present invention, the reloading instruction is generated without committing to the reloaded value. The reloaded value is chosen later, when the instruction that actually needs the value is generated. The generator distances the reloading instruction from the instruction that actually needs the value, thus making it possible to avoid fixed test patterns and to generate interference-free test segments. This is achieved by conditioning the value of the resource on another uninitialized resource. For example, the reloading instruction may be a Load instruction from some previously unused memory location into the reloaded register. The memory location and the reloaded register are marked as coupled, until a future instruction generation requires the register to have some specific value. At that point, the value in the reloaded register is obtained by retroactively committing that value as the initialization value of the memory location in the now-historic reloading instruction.

The invention provides a method of verifying a design of a processor, including generating a stream of instructions for the processor. The stream includes a client instruction referencing at least one resource that is accessible to the processor, and includes a reloading instruction in the stream prior to the client instruction. The reloading instruction conditions the resource so as to satisfy a constraint of the client instruction. The reloading instruction is separated in the stream from the client instruction by at least one other instruction.

According to an aspect of the method, the resource includes a slave resource and a reloaded resource. The reloading instruction operates on the slave resource and the reloaded resource, wherein the reloaded resource is an operand of the client instruction.

According to yet another aspect of the method, the slave resource is a memory location and the reloaded resource is a register.

In still another aspect of the method the step of including a reloading instruction also includes establishing a mapping between the reloaded resource and the slave resource, and adding the mapping to a list of available mappings, in which members of the list of available mappings each have a previously used reloaded resource and a previously used slave resource. The method further includes locating a member of the list, wherein the previously used slave resource thereof and the previously used reloaded resource thereof conform to a present requirement, changing an initialization value of the previously used slave resource of the member to a presently required value, changing a current value of the previously used reloaded resource of the member to the presently required value, changing a current value of the previously used slave resource of the member to the presently required value, assigning the previously used slave resource as the slave resource, and assigning the previously used reloaded resource as the reloaded resource.

An additional aspect of the method includes removing the located member from the list of available mappings.

One aspect of the method includes inspecting the stream prior to including a reloading instruction to identify a candidate instruction for service as the reloading instruction, wherein the candidate instruction has a source and a target, establishing a candidate mapping between the source and the target, and adding the candidate mapping to the list of available mappings.

According to another aspect of the method, the mapping is a non-identity mapping.

According to a further aspect of the method, there is a chain of reloading instructions.

According to still another aspect of the method, the reloading instruction is a Load instruction.

According to an additional aspect of the method, the reloading instruction has an immediate operand.

Yet another aspect of the method includes dividing the stream into segments, wherein the step of including a reloading instruction is performed only in selected ones of the segments.

The invention provides a computer software product, including a computer-readable medium in which computer program instructions are stored, which instructions, when read by a computer, cause the computer to perform a method of verifying a design of a processor. The method includes generating a stream of instructions for the processor, wherein the stream has a client instruction referencing at least one resource that is accessible to the processor, and including a reloading instruction in the stream prior to the client instruction. The reloading instruction conditions the resource so as to satisfy a constraint of the client instruction.

The reloading instruction is separated in the stream from the client instruction by at least one other instruction.

According to an aspect of the computer software product, the resource includes a slave resource and a reloaded resource. The reloading instruction operates on the slave resource and the reloaded resource, wherein the reloaded resource is an operand of the client instruction.

According to yet another aspect of the computer software product, the slave resource is a memory location and the reloaded resource is a register.

In still another aspect of the computer software product the step of including a reloading instruction also includes establishing a mapping between the reloaded resource and the slave resource, and adding the mapping to a list of available mappings, in which members of the list of available mappings each have a previously used reloaded resource and a previously used slave resource. The method further includes locating a member of the list, wherein the previously used slave resource thereof and the previously used reloaded resource thereof conform to a present requirement, changing an initialization value of the previously used slave resource of the member to a presently required value, changing a current value of the previously used reloaded resource of the member to the presently required value, changing a current value of the previously used slave resource of the member to the presently required value, assigning the previously used slave resource as the slave resource, and assigning the previously used reloaded resource as the reloaded resource.

In an additional aspect of the computer software product the method includes removing the located member from the list of available mappings.

In one aspect of the computer software product the method includes inspecting the stream prior to performing including a reloading instruction to identify a candidate instruction for service as the reloading instruction, wherein the candidate instruction has a source and a target, establishing a candidate mapping between the source and the target, and adding the candidate mapping to the list of available mappings.

According to another aspect of the computer software product, the mapping is a non-identity mapping.

According to a further aspect of the computer software product, there is a chain of reloading instructions.

According to still another aspect of the computer software product, the reloading instruction is a Load instruction.

According to an additional aspect of the computer software product, the reloading instruction has an immediate operand.

In yet another aspect of the computer software product the method includes dividing the stream into segments, wherein the step of including a reloading instruction is performed only in selected ones of the segments.

The invention provides a verification system for verifying an architecture of a processor, including a test generator for generating a stream of instructions that can be executed by the processor, the stream including a constrained client instruction that references resources. The test generator has a reloading module that is adapted to include a reloading instruction in the stream prior to the client instruction. The reloading instruction is separated in the stream from the client instruction by at least one other instruction. The verification system includes an execution facility for executing the instructions on the processor, wherein the resources are accessible to the processor, and wherein execution of the reloading instruction by the processor conditions a reloaded resource of the resources so as to satisfy a constraint of the client instruction.

According to one aspect of the verification system, the resources further comprise a slave resource, and the reloading instruction operates on the slave resource and the reloaded resource, wherein the reloaded resource is an operand of the client instruction.

According to another aspect of the verification system, the slave resource is a memory location and the reloaded resource is a register.

According to a further aspect of the verification system, the test generator includes a first program for establishing a mapping between the reloaded resource and the slave resource and adding the mapping to a list of available mappings. Members of the list of available mappings each have a previously used reloaded resource and a previously used slave resource. The test generator includes a second program for locating one of the members, wherein the previously used slave resource thereof and the previously used reloaded resource thereof conform to a present requirement. The test generator has a third program for changing an initialization value of the previously used slave resource of the member to a presently required value, and for changing a current value of the previously used reloaded resource of the member to the presently required value, and for changing a current value of the previously used slave resource of the member to the presently required value.

According to yet another aspect of the verification system, the test generator also includes a fourth program for removing the one member from the list of available mappings.

Still another aspect of the verification system includes a fifth program for inspecting the stream to identify a candidate instruction for service as the reloading instruction. The fifth program includes establishing a candidate mapping between a source and a target of the candidate, and adding the candidate mapping to the list of available mappings.

According to an additional aspect of the verification system, the mapping is a non-identity mapping.

According to one aspect of the verification system, there is a chain of reloading instructions.

According to another aspect of the verification system, the reloading instruction is a Load instruction.

According to yet another aspect of the verification system, the reloading instruction has an immediate operand.

According to a further aspect of the verification system, there are a plurality of reloading instructions and the test generator also includes a sixth program for dividing the stream into segments, wherein the test generator includes the reloading instructions only in selected ones of the segments.

BRIEF DESCRIPTION OF THE DRAWINGS

For a better understanding of these and other objects of the present invention, reference is made to the detailed description of the invention, by way of example, which is to be read in conjunction with the following drawings, wherein:

FIG. 6 is a test listing similar to FIG. 3, illustrating the effect of retroactively changing the value in a memory location for the sake of a client instruction in accordance with a preferred embodiment of the invention;

FIG. 7 is a test listing similar to FIG. 4, illustrating the effect of overwriting a slave resource in accordance with a preferred embodiment of the invention;

FIG. 8 is a test listing that includes a reloading chain in accordance with a preferred embodiment of the invention;

FIG. 9 is a test listing illustrating the use of reloading instructions other than Load instructions in accordance with a preferred embodiment of the invention.

DETAILED DESCRIPTION OF THE INVENTION

In the following description, numerous specific details are set forth in order to provide a thorough understanding of the present invention. It will be apparent to one skilled in the art, however, that the present invention may be practiced without these specific details. In other instances well-known circuits, control logic, and the details of computer program instructions for conventional algorithms and processes have not been shown in detail in order not to unnecessarily obscure the present invention.

Software programming code, which embodies aspects of the present invention, is typically maintained in permanent storage, such as a computer readable medium. In a client/server environment, such software programming code may be stored on a client or a server. The software programming code may be embodied on any of a variety of known media for use with a data processing system, such as a diskette, or hard drive, or CD-ROM. The code may be distributed on such media, or may be distributed to users from the memory or storage of one computer system over a network of some type to other computer systems for use by users of such other systems. The techniques and methods for embodying software program code on physical media and distributing software code via networks are well-known and will not be further discussed herein.

System Overview.

Figures 1, 2:
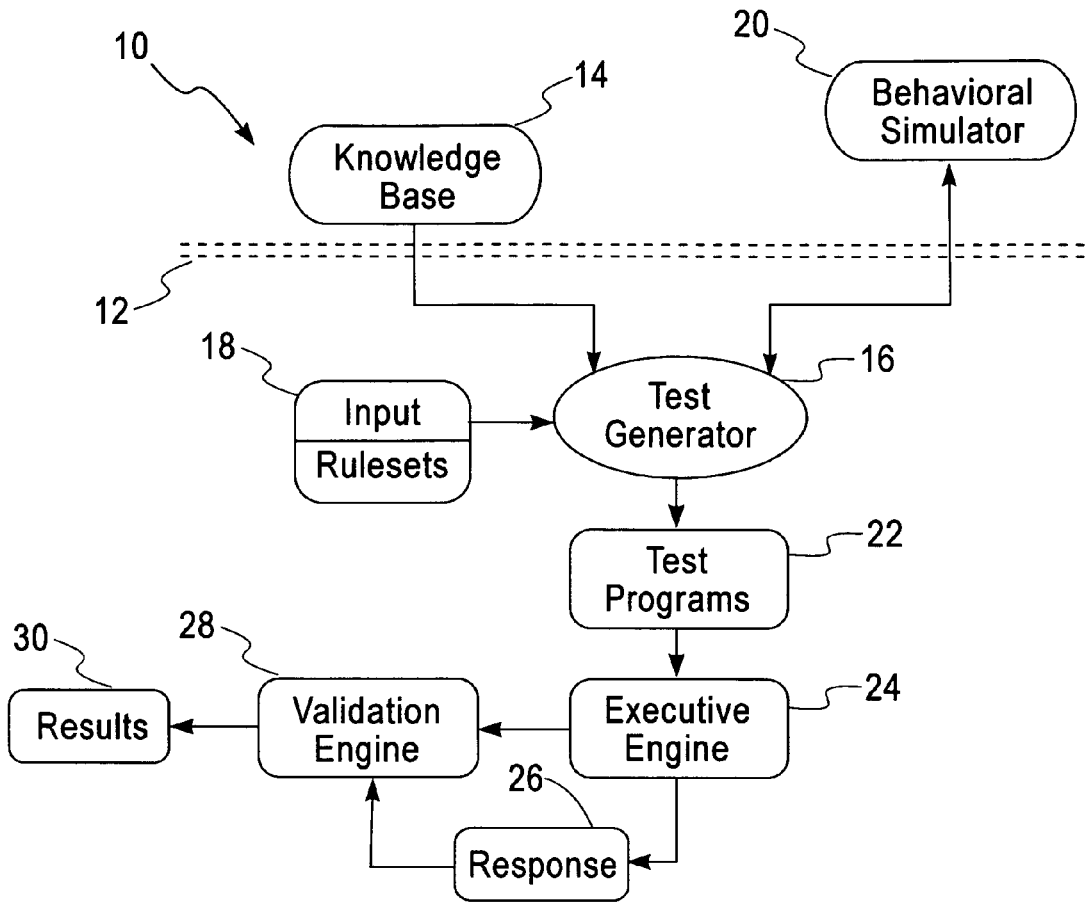
FIG. 1 is a block diagram of a verification system that is operable in accordance with a preferred embodiment of the invention.
FIG. 2 is a test listing, in which an Add instruction producing a zero result is generated using adjacent reloading in accordance with the prior art.

Turning now to the drawings, reference is made to FIG. 1, which is a block diagram of a verification system 10 that is operable in accordance with a preferred embodiment of the invention. The teachings of the present invention are not restricted to systems that are configured like the verification system 10, but are applicable to many testing systems that have different architectures than the verification system 10. Typically, the architectures are verified through a suite of test cases to be generated. The solution given here is also appropriate for many other test generation approaches, including manual test generation.

The verification system 10, which can be used for verifying a software or hardware implementation, has several basic interacting components. Those components of the verification system 10 that are located above a broken line 12 are dependent on the specification of the implementation being verified, while those located below the line 12 are independent of the specification.

The verification system 10 enables the creation of tests that have various degrees of randomness. The ability of the verification system 10 to introduce random unspecified values is generally desirable, since design flaws in practice are usually unpredictable.

An abstract knowledge base 14 holds a formal description of the specification of the system. This specification may be stored in a database, which may also incorporate testing knowledge of the system design, and may include testing constraints and coverage criteria.

A generic test program generator engine 16 has a user input 18, which influences the algorithms used to generate test cases.

A behavioral simulator 20 can be used to predict the results of instruction execution in accordance with the specification of the system being verified. It is possible to employ the techniques of the invention in verification systems that do not employ a behavioral simulator.

Test programs 22 are executed by an execution engine 24 on an implementation of the system-under-test. The execution engine 24 can be a simulator of the system-under-test, or the system-under-test itself. The system-under-test can be a complex software implemented system, for example middleware, or a hardware simulator. Indeed, the system-under-test itself may be a simulator.

Execution of the test programs 22 produces a response 26 from the system. The response 26 is typically submitted to a validation process, represented in FIG. 1 as a validation engine 28, which has knowledge of the expected response, validates the response 26, and produces validation results 30.

Notation and Definitions.

In the disclosure herein, registers are denoted R1, R2, etc., and memory locations are denoted: M[address]. The notation I{instruction-mnemonic} denotes the instruction specified by the mnemonic instruction-mnemonic.

The "quality" of a test refers to the test's ability to produce interesting instructions by means of satisfying constraints. The term "uniform quality" means that the quality of the test at its early stages, where there are many uninitialized resources that can be set to any required value, is the same as the quality of the test at its latter stages, where there are no longer such uninitialized resources, but there are mapped resources.

Test Programs.

A test is a composition of instructions and data used by these instructions. Generating a test involves solving many constraints of various types. For example, the user of the test generator may ask for 20 instructions followed by two Add instructions, which are to give a result of zero. The generator still has some freedom in selecting the 20 instructions, and in selecting the resources and data for the test instructions. But these selections must conform to the constraints given by the user, i.e., the zero result, and with constraints that derive from the architectural specification of the system-under-test. For example, instructions may need to be placed in word aligned memory locations. Some constraints can arise dynamically during the generation of the test, e.g., register R4 must be assumed to contain the value 5 due to some previously generated instruction.

Final or intermediate predicted resource values may be added to the test, as specified by the specification or architecture of the system-under-test. Then, as the test is simulated or executed, the simulated or actual values of the resources can be compared with the expected values. Every difference implies a design flaw. However, even a test with no predicted results can still be used for verification by using additional tools to monitor the design's behavior during simulation and verify that consistency rules, such as memory coherence, are being observed.

Referring again to FIG. 1, in general, a test created by the test program generator engine 16 contains stimuli for the system-under-test. Running the test involves initializing the resources specified in the test, and then causing the execution engine 24 to simulate or otherwise execute the instructions pointed to by a program counter (not shown).

Reference is now made to FIG. 2, which is a fragmentary listing of a test 32, in which the test program generator engine 16 is required to generate an Acid instruction with a zero result, in which the operands are two registers. The description of FIG. 2 should be read in conjunction with FIG. 1 The test 32 exemplifies the technique of adjacent reloading. It begins with a series of instructions 34 that store the value –7 in register R2, and the value 13 in register R5. Next, an instruction 36 loads the contents of memory location M[2000], containing the value 7, into register R1. An instruction 38, adjacent to the instruction 36, then adds the registers R1 and R2, and stores the result, 0, in register R3 Next, an instruction 40 loads the contents of memory location M[2004], containing the value –13, into register R4. An instruction 42, adjacent to the instruction 40, then adds the registers R4 and R5, and stores the result, 0, in register R6.

In creating the test 32, the test program generator engine 16 can achieve the desired results by finding two registers that have not been used before and initializing them with two opposite numbers. Alternatively, the test program generator engine 16 could initialize one unused register with an opposite value of the value of some used register. This is possible as long as there is at least one uninitialized register. However, as the test generation progresses, more and more registers are used and eventually a free register may no longer be available for initialization. The test program generator engine 16 can sometimes overcome this by keeping track of current resource values through the use of the behavioral simulator 20 to simulate the instructions as they are being generated, a process termed "dynamic generation". Using the behavioral simulator 20, the test program generator engine 16 can sometimes find registers that are already initialized but have values that happen to satisfy the constraint in combination. For example, to reach the sum zero, the test program generator engine 16, operating as a dynamic generator, can look for two used registers that happen to have opposite values. Obviously, this only works if such a pair can be found. Such constraints affect registers more severely than memory, since the memory space is typically much larger and there is often no problem finding uninitialized memory in order to comply with the constraints.

Reloading Solutions.

Continuing to refer to FIG. 1 and FIG. 2, the reloading solution to the above-noted problem is to precede the instruction for which the constraint needs to be solved, with an extra instruction that directly assigns a register with the value required by the constraint. Such an assignment is termed "reloading". The extra instruction is called the "reloading instruction". The target of the reloading instruction is termed the "reloaded resource" and the source of the reloading instruction is termed the "slave resource". The instruction that later uses the reloaded resource to comply with a constraint is called the "client instruction". For example, suppose, in the test 32 (FIG. 2), that all the registers have already been used in the test and therefore hold fixed values. In addition, no two registers happen to hold values that add up to zero. The Add instruction could be preceded by a Load instruction that loads some register with a value that is the opposite of the value of another register. Then both registers would be used by the Add instruction. As noted above, the test 32 was generated with a request for two Add instructions that give a zero result. For the first Add, the instruction 36 is the reloading instruction and the instruction 38 is the client instruction. The memory address M[2000] is the slave resource and the register R1 is the reloaded resource.

The use of reloading instructions is most appropriate for a generation model where the instructions are generated in program order. Generating instructions involves first selecting the instruction to generate, and then selecting the resources used by the instruction and their values.

There are two problems to consider in the reloading solution presented above:

First, a reloading instruction such as the instruction 36 is an interference in the test, which may spoil the verification value of a specific scenario requested by the user. For example, a user may design a scenario that causes a cache hit by asking to generate two consecutive Load instructions to some specific cache line. Now, suppose that the second Load instruction also involves constraints that require a reloading instruction to be added between the two loads. The reloading instruction could potentially cause the line to be thrown out of the cache in order to make room for the loaded slave resource. Then the second Load instruction would no longer hit in the cache.

Second, if the reloading instruction is always placed immediately before the client instruction, then in long tests a pattern is created, wherein the client instruction is mostly verified in conjunction with the reloading instruction. Different patterns, which lack an immediately preceding reloading instruction, but which could potentially trigger design flaws would be neglected. For example, if every Add instruction that uses a reloaded register is preceded by a Load instruction, the verification process may miss a flaw that is uncovered only when an Add instruction is preceded by another Add instruction.

Consequently, it seems preferable to use uninitialized registers if possible, rather than insert a reloading instruction. A dynamic generator should also prefer to use initialized registers that happen to have values suitable for solving the constraints rather than to insert a reloading instruction. In either case, reloading becomes unavoidable when all the registers have already been used and contain values that do not comply with the constraints.

Preemptive Reloading.

Using a preemptive reloading approach, the reloading instruction is added to the test before the generator has any idea of the value that would be needed in the reloaded resource, or indeed if reloading will be needed at all. In this section, it is assumed there is an explicit directive that reloading is to take place. Automatic usage methodologies are disclosed hereinbelow.

Figures 3, 4:
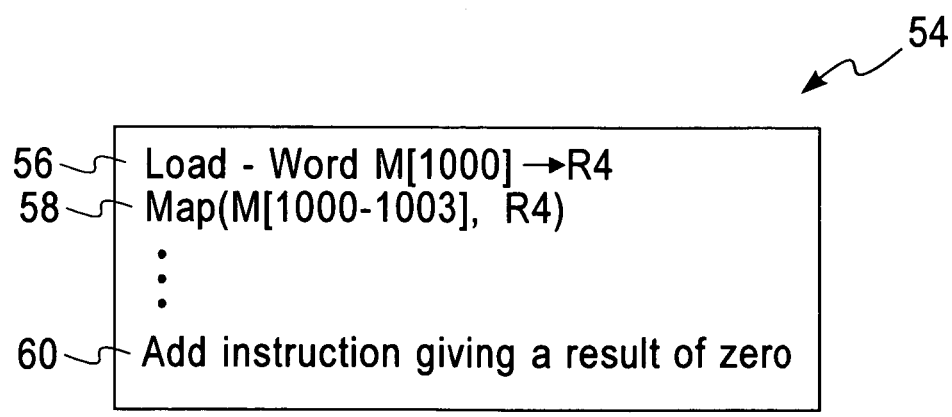
FIG. 3 is a test listing, in which an Add instruction producing a zero result is generated using preemptive reloading in accordance with a preferred embodiment of the invention.
FIG. 4 is a test listing illustrating a reloading request that involves preemptive reloading and mapping between a reloaded resource and a slave resource in accordance with a preferred embodiment of the invention.

Reference is now made to FIG. 3, which illustrates an example of a test 44 in which the test program generator engine 16 is required to generate an Add instruction with a zero result according to a preferred embodiment of the invention, and in which the operands are two registers. The results of the test 44 are identical to those of the test 32 (FIG. 2). However, the structures of the test 44 and the test 32 differ, in that reloading instructions 46, 48 are separated in the instruction stream from client instructions 50, 52. The test 44 exemplifies preemptive reloading.

Reference is now made to FIG. 4, which is a listing illustrating a reloading request 54 that involves preemptive reloading and mapping between a reloaded resource and a slave resource in accordance with a preferred embodiment of the invention. The description of FIG. 4 should be read in conjunction with FIG. 1. The test program generator engine 16 (FIG. 1) keeps track of all existing reloaded and slave resources that were mapped in previous reloading instructions. In the reloading request 54, the test program generator engine 16 is required to reload a 32-bit register R4 from an address 1000 in a reloading instruction 56 and to map the register R4 to memory locations M[1000–1003] in a mapping directive 58. Eventually a client Add instruction 60 is required, which is to yield a zero result.

The reloading instruction 56 is generated as a normal instruction by the test program generator engine 16. Thus, if at any point the test program generator engine 16 decides that the reloading instruction 56 will not serve for reloading, then it suffices to erase the associated mapping from the list of available mappings. The reloading instruction 56 remains in the test as a valid instruction. Possible reasons for unmapping a reloading instruction are disclosed hereinbelow.

Figure 5:
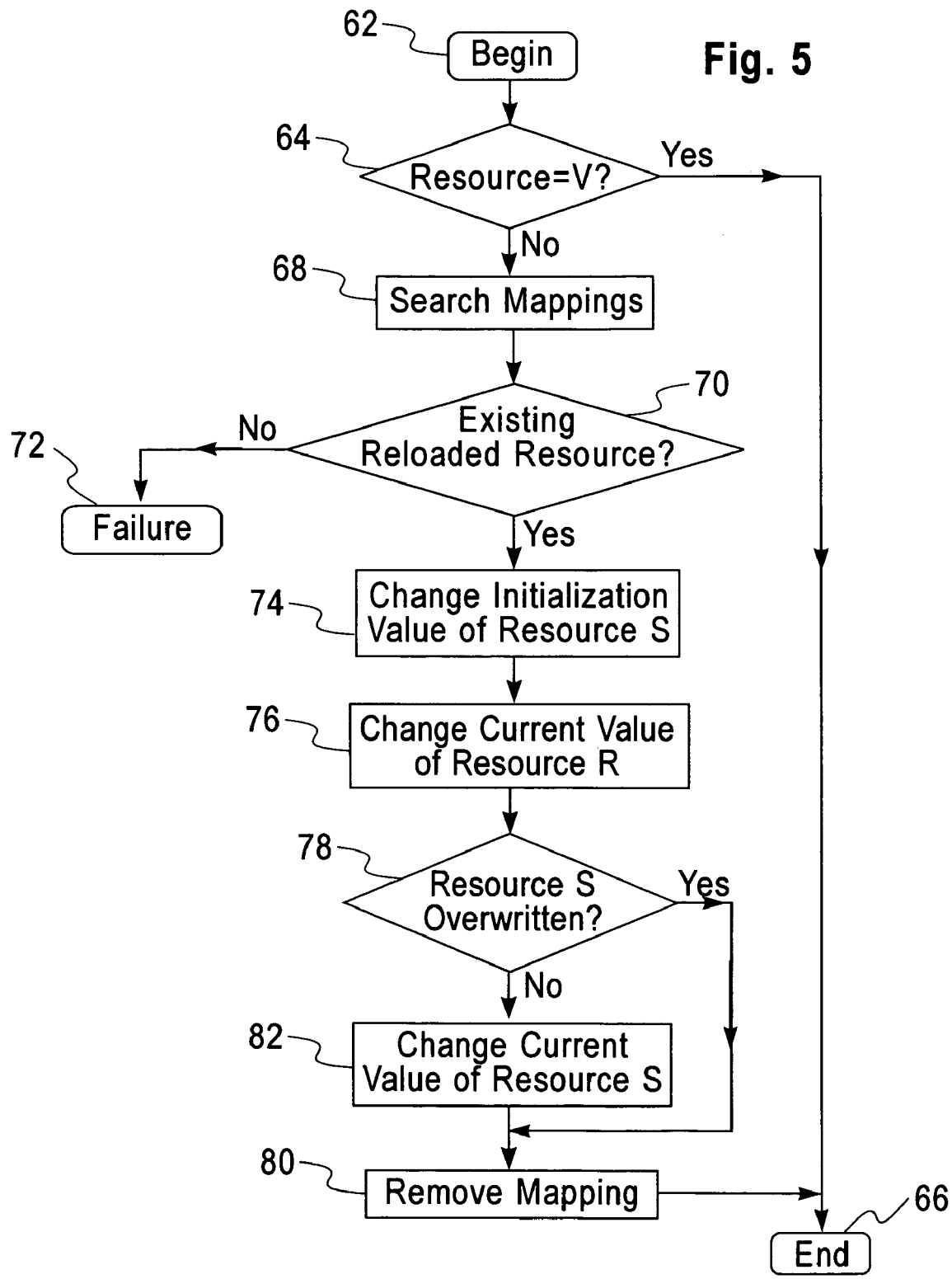
FIG. 5 is a flow chart illustrating a use of mapped resources in accordance with a preferred embodiment of the invention.

Reference is now made to FIG. 5, which is a flow chart illustrating a use of mapped resources in accordance with a preferred embodiment of the invention. The description of FIG. 5 should be read with continued reference to FIG. 1 and FIG. 4. In initial step 62, it is assumed that the test program generator engine 16 generates an instruction that needs a resource of some type to have some specific value V.

Next, at decision step 64 a determination is made whether any resources of the required type have already been used and that one of them happens to have the value V or whether any resources of the required type have not already been used and may therefore be initialized with any required value. If the determination at decision step 64 is affirmative, then there is no need for a reloading instruction and resources with the required values can be used without resort to this procedure. Control proceeds to final step 66.

If the determination at decision step 64 is negative, then control proceeds to step 68, where a search is made of existing resource mappings. Then, at decision step 70 a determination is made whether there is any mapping left over from a previous preemptive reloading having a reloaded resource of the needed type.

If the determination at decision step 70 is negative, then control proceeds to final step 72, where failure is reported.

If the determination at decision step 70 is affirmative, then control proceeds to step 74. A reloaded resource R was found to be mapped to a slave resource S. The initialization value of the resource S is changed to the value V.

Next, at step 76 the current value of the resource R is changed to the value V.

Next, at decision step 78 a determination is made whether the resource S was written over since the reloading instruction took place.

If the determination at decision step 78 is affirmative, then control proceeds to step 80, which is disclosed below.

If the determination at decision step 78 is negative, then control proceeds to step 82, where the current value of the resource S to is changed to the value V. Control proceeds to step 80.

At step 80, the mapping of the resource R to the resource S is removed from the list of available mappings. At this point, the net result of the above actions is that the value that was reloaded into the reloaded resource has been retroactively set to be the value that is now required by the client instruction. Control now proceeds to final step 66 and the procedure ends.

Referring again to the reloading sequence in FIG. 4. The test program generator engine 16 first generates the reloading instruction 56, which is a Load instruction. As part of this generation, it would decide on an initialization value for the memory location, for example the value 5. At this point, the initialization value of M[1000–1003] is 5 and the current value for the memory locations M[1000–1003] and for the register R4 is also 5. It is now assumed that later in the generation process the test program generator engine 16 needs to generate an Add instruction that produces a zero result, in which the operands are two registers. However, no two registers happen to hold opposite values. Suppose that the register R1 holds the value 7 at that point. The test program generator engine 16 can determine that the register R4 is mapped to the memory locations M[1000–1003]. The test program generator engine 16 can change the initialization value of the memory locations M[1000–1003] and can change the current value of the register R4 from the value 5 to the value –7. The current value of the memory locations M[1000–1003] is also changed to the value –7 if no instruction has overwritten this memory area subsequent to the reloading instruction. The decision to initialize the slave resource (the memory locations M[1000–1003]) with the value –7 is made late in the process, while generating the instruction 60.

The approach disclosed with reference to FIG. 4 requires that two conditions be satisfied in order to work successfully. First, there can be no instructions between the reloading instruction and the client instruction that read either the reloaded resource or the slave resource. Referring again to FIG. 5, step 74 provides an example of such a retroactive change. This will be further appreciated with reference to FIG. 6, which shows a fragment of a test 84. FIG. 6 is similar to FIG. 3, in which like elements are given like reference numerals. An extra instruction 86, Load M[2000]-> R9, has been inserted between the instruction 48 and the instruction 50. If the procedure illustrated in FIG. 5 were performed on the test 84, the initialization of the memory location M[2000] in the instruction 86 would be retroactively changed in step 74 from the value 5 to the value –7. However, it would then be necessary to change the value in the register R9 to the value –7. This presents a difficulty, as allowing such a change in the register would require a list of such intermediate changes and their side effects to be maintained. To avoid this burden, it is preferable to simply remove, or waste the mapping of the location M[2000} to R1 when the instruction 86 is generated.

Second, no instructions between the reloading instruction and the client instruction may overwrite the reloaded resource. However, overwriting the slave resource is allowed, and is dealt with in decision step 78. This is shown with reference to FIG. 7, which shows a fragment of a test 88. FIG. 7 is similar to FIG. 4, in which like elements are given like reference numerals. An extra instruction 90, Store 9>M[1000], has been inserted between the mapping directive 58 and the instruction 60. The slave resource M[1000] has been overwritten by the instruction 90. However, no further action is required. In the example shown in FIG. 7, and with continued reference to FIG. 5, the slave resource was overwritten with a value of 9, and would hold the value 9 prior to initial step 62 (FIG. 5). Changing its initialization from the value 5 to the value −7 in step 74 would still leave the slave resource with a current value 9 at the time step 82 is performed. Thus, overwriting the slave resource implies that it holds the correct value 9, regardless of whether the slave resource was initialized with the value 5 or the value −7. The generator can attempt to avoid overwriting reloaded resources. But if they are necessary the generator must remove the mapping from the list of available mappings, thereby "wasting" the reloading instruction.

Opportunistic Reloading.

In the basic preemptive reloading approach described above the reloading instructions are added to the original requested test scenario, and may therefore form an interference in the test. In a technique termed "opportunistic reloading", instructions are identified in the test's original scenario as candidates for service as reloading instructions. When such candidate instructions are identified, a mapping is specified between the source and the target of the instructions, typically source memory and a target register. However, other sources and targets are possible, as is disclosed in further detail hereinbelow. The mapping is added automatically to the list of available mappings. For example, suppose the original test scenario that needs to be generated includes a Load instruction. Also assume that the requirements of this scenario do not impose restrictions relating to the data being loaded or the address from which the data is loaded. Such a Load instruction can serve as a reloading instruction. The generator automatically adds a mapping between the source memory and the target register. The original scenario can now be generated. Future client instructions may freely use the reloaded register without creating any test interference. Obviously, such opportunistic reloading is only possible in cases where the original test scenario includes instructions that can serve for reloading.

Non-Identity Mappings.

Referring again to FIG. 4, the mapping created between the register R4 and the memory locations M[1000–1003] is the identity map in the sense that the value in the register R4 equals the initialization value of the memory locations M[1000–1003]. This is not necessarily the case with all potential reloading instructions. For example, consider an instruction NEGATE, which loads 4 bytes from memory, computes its negation and then stores the value in a target register. Now, if a client instruction needs the value 5 then the slave resource would need to be initialized with the value −5, rather than the value 5 if the instruction NEGATE is used. To handle such reloading instructions, the mapping needs to indicate a mapping function between the required value, which is expected in the reloaded resource and the value in the slave resource.

It is useful to provide reloading instructions with non-identity mappings, because this permits a wider range of test patterns, and facilitates opportunistic reloading by increasing the number of instructions that can serve for reloading.

Reloading Chains.

The reloading sequence typically uses a slave resource from a resource family that contains more available resources than are available in the reloaded resource's family, e.g., reloading from memory into registers. However, the system-under-test does not always have an instruction for every pair of resource types. Many designs only have instructions that move data between memory and general-purpose registers and instructions that move data between general-purpose registers and special-purpose registers. In such designs, a series of reloading instructions, called "reloading chains," can be used to reload special-purpose registers from memory.

Reference is now made to FIG. 8, which illustrates the use of a fragment of a test 92 that includes a reloading chain in accordance with a preferred embodiment of the invention. In an instruction 94, the data is moved from memory locations M[1000–1003] to a general-purpose register GPR4 and from there an instruction 96 moves the data to a special-purpose register SPR7. A mapping is created from the memory locations M[1000–1003] to the special-purpose register SPR7 by a mapping instruction 98. Thus, if a client instruction needs some value in the special-purpose register SPR7, it suffices to initialize the memory locations M[1000–1003] with that value. An XOR instruction 100 serves to reset the general-purpose register GPR4 to zero; however, any instruction that sets the general-purpose register GPR4 to a constant could be substituted for the XOR instruction 100. Without the XOR instruction 100, any future instruction that precedes the client instruction and reads the general-purpose register GPR4 would require that the generator erase the mapping to the memory locations M[1000–1003] because these locations could no longer serve as a slave resource. Any retroactive change of the memory locations M[1000–1003] for the sake of a client instruction may interfere with the instruction that read the general-purpose register GPR4. It should be noted that the ends of a chain are mapped to one another. Thus the memory location M[1000] and the special-purpose register SPR7 are mapped to one another. The general-purpose register GPR4 is in the middle of the chain and is not mapped, because it cannot serve as a reloaded register. In fact, it is immediately overwritten by the XOR instruction 100 for the reasons given above.

Mapping into the Instruction Fetch Area.

So far, all the foregoing reloading examples have used a Load instruction as the reloading instruction. In many test scenarios, Load instructions create more interference than internal register manipulation instructions. Load instructions from memory can cause long delays and disrupt the timing of the scenario. However, instructions that only manipulate registers and immediate operands, i.e., operands where the data is given as part of the instruction's binary representation, can serve as reloading instructions. For example, suppose the architecture of the system-under-test includes a Set_Immediate instruction, which sets a target register with data given in an immediate field of the instruction. In this case, the area in memory from which the Set_Immediate instruction is fetched, and which contains the immediate field, can serve as the slave-resource.

Reference is now made to FIG. 9, which is a fragment of a test 102 illustrating the use of instructions other than Load instructions for reloading in accordance with a preferred embodiment of the invention. In a Set_Immediate instruction 104, the register R4 is conditioned by the contents of an immediate field 106, which has the value 0 in the test 102. Then, in a mapping instruction 108, the register R4 is mapped to the immediate field 106. It is assumed that the program counter (not shown) of the processor in the system-under-test points to the memory area containing the binary representation of the Set_Immediate instruction 104, and that a location Program-Counter+2 110 points to the location in memory that holds the immediate field 106. Furthermore, it is assumed that the immediate field 106 is the same size as the register R4. Instructions in which the immediate field 106 and the register R4 are unequal in size can be handled with non-identity mappings or by using multiple mappings from different parts of the reloaded register into immediate fields of different instructions.

Reloading Module.

Figure 10:
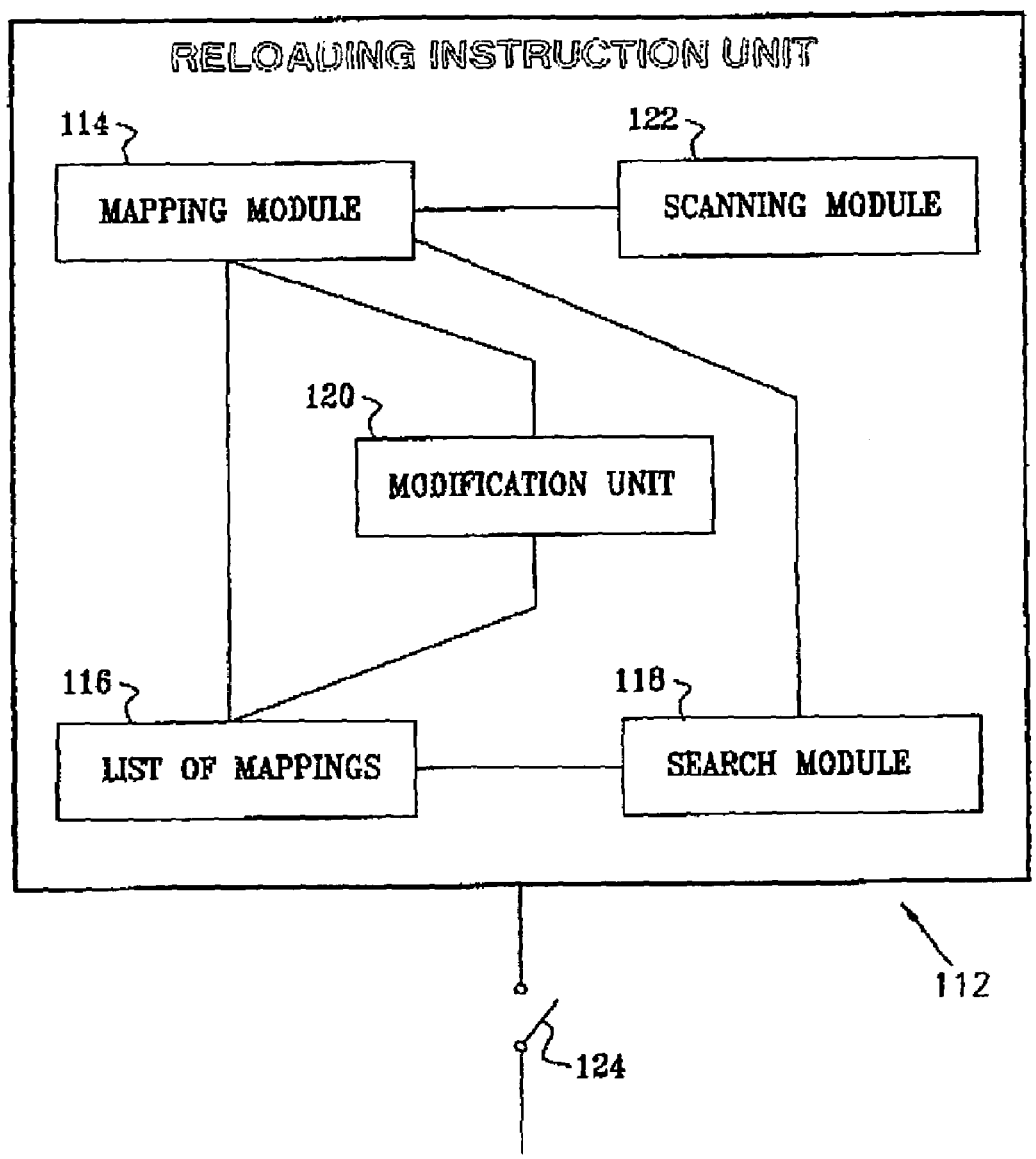
FIG. 10 is a detailed block diagram of a reloading module of a test generator in the verification system shown in FIG. 1 that is adapted to implement preemptive reloading in accordance with a preferred embodiment of the invention.

Reference is now made to FIG. 10, which is a block diagram of a reloading instruction unit 112 of the test program generator engine 16 (FIG. 1) that is adapted to implement preemptive reloading as disclosed hereinabove in accordance with a preferred embodiment of the invention. The reloading instruction unit 112 possesses several modules, which are typically realized as software programs, but can be realized as hardware circuits, and may even include independent processing units in a multiprocessor-implemented test program generator.

The reloading instruction unit 112 is generally responsible for injecting reloading instructions into the instruction stream, appropriately separated from client instructions, and for using the resources reloaded in these reloading instructions for satisfying constraints by means of retroactive changes to slave resources.

Once a reloading instruction has been specified, a mapping module 114 establishes a mapping between the reloaded resource and the slave resource of the reloading instruction. This mapping is added to a list of available mappings 116, which is modifiable by the mapping module 114.

A search module 118, which is aware of a currently needed constraint, is responsible for scanning the list of available mappings 116 in order to identify resources that could satisfy the current constraint due to their earlier use as operands of a reloading instruction.

When a suitable member of the list of available mappings 116 has been located by the search module 118, it is communicated to the mapping module 114. The mapping module 114 is linked to a modification unit 120, which is responsible for changing values of mapped resources. The modification unit 120 changes the initialization value of a previously used slave resource in the newly located member to a presently required value, provided that the slave resource has not been overwritten subsequent to the reloading instruction, as has been explained with respect to the description of decision step 78 (FIG. 5). The modification unit 120 changes the current value of the previously used reloaded resource in the located member to the presently required value, and changes the current value of the previously used slave resource to the presently required value. The mapping module 114 is responsible for removing the mapping associated with the previously used slave resource and the previously used reloaded resource from the list of available mappings 116, and includes a suitable subroutine for manipulating the list of available mappings 116.

When the test program generator engine 16 (FIG. 1) has been directed to employ opportunistic reloading, a scanning module 122 is activated. The scanning module 122 is responsible inspecting the instruction stream to identify candidate instructions for service as reloading instructions. When a candidate has been identified, the scanning module 122 coordinates with the mapping module 114 to establish a mapping between the source and the target of the newly identified candidate instruction, and to add the new mapping to the list of available mappings 116.

The reloading instruction unit 112 includes a switch 124 so that it can be disabled whenever it is desired not to use preemptive reloading during test generation. Typically the switch 124 is opened and closed when the instruction stream is segmented. Thus similar tests with and without the benefits and drawbacks of preemptive loading can be prepared in different test segments.

Implementation of Preemptive Reloading.

Preemptive reloading has been implemented in the above-noted Genesys-Pro generator in connection with verification of various processor designs of the PowerpC™ processor. The Genesys-Pro generator has a rich test specification language that facilitates the definition of intricate reloading sequences and mappings. A preemptive reloading sequence is automatically inserted when it is recognized that the number of "free" resources of a resource family has dropped below some threshold. A free resource is a resource, the value of which can be determined by the Genesys-Pro generator. Free resources include both unused resources, which can be initialized, with any required value and mapped resources, which can be set to any required value through retroactive initialization of mapped slave resources. The threshold is specific for each resource family, and can be controlled by the user.

The user can vary the activation of the reloading mechanism within different segments of the test. For example, reloading may be allowed in a segment of the test, while in a succeeding segment reloading may be disabled. Such "reloading-free" segments only include client instructions that are guaranteed to be free of reloading interference. Furthermore, several optional reloading sequences can be defined for each resource family, in order to increase the variations in the resulting test patterns. Preemptive reloading has enabled the Genesys-Pro generator to enforce mandatory constraints in longer tests. A consequence of this capability is an increase in the number of test instructions from several hundred instructions to a virtually unlimited number, while maintaining uniform quality, avoiding fixed reloading patterns, and enabling reloading-free" test segments. In the case of the PowerPC processor, much of the advantage is realized from reloading of resources of the address translation unit.

It will be appreciated by persons skilled in the art that the present invention is not limited to what has been particularly shown and described hereinabove. Rather, the scope of the present invention includes both combinations and sub-combinations of the various features described hereinabove, as well as variations and modifications thereof that are not in the prior art, which would occur to persons skilled in the art upon reading the foregoing description.

The invention claimed is:

1. A method of verifying a design of a processor, comprising the steps of:

generating a stream of instructions for said processor, for verification of said design thereof responsively to an execution of said instructions, said stream including a client instruction that is accessible to said processor;

preemptively including a reloading instruction in said stream upstream from said client instruction, said reloading instruction referencing a slave resource, wherein a value needed to condition said slave resource in order to satisfy a constraint of said client instruction is unknown prior to generation of said client instruction; and determining an initialization value for said slave resource while generating said client instruction, wherein an execution of said reloading instruction by said processor conditions said slave resource so as to satisfy said constraint of said client instruction, said reloading instruction being separated in said stream from said client instruction by at least one other of said instructions.

2. The method according to claim 1, wherein said reloading instruction operates on said slave resource and a reloaded resource, wherein said reloaded resource is an operand of said client instruction.

3. The method according to claim 2, wherein said slave resource is a memory location and said reloaded resource is a register.

4. The method according to claim 2, wherein said step of including a reloading instruction further comprises the steps of:
    establishing a mapping between said reloaded resource and said slave resource;
    adding said mapping to a list of available mappings, members of said list of available mappings having a previously used reloaded resource and a previously used slave resource;
    locating one of said members wherein said previously used slave resource thereof and said previously used reloaded resource thereof conform to a present requirement;
    changing an initialization value of said previously used slave resource of said one member to a presently required value;
    changing a current value of said previously used reloaded resource of said one member to said presently required value;
    changing a current value of said previously used slave resource of said one member to said presently required value;
    assigning said previously used slave resource as said slave resource; and
    assigning said previously used reloaded resource as said reloaded resource.

5. The method according to claim 4, further comprising the step of removing said one member from said list of available mappings.

6. The method according to claim 4, further comprising the steps of prior to performing said step of including a reloading instruction:
    inspecting said stream to identify a candidate instruction for service as said reloading instruction, said candidate instruction having a source and a target;
    establishing a candidate mapping between said source and said target; and
    adding said candidate mapping to said list of available mappings.

7. The method according to claim 4, wherein said mapping is a non-identity mapping.

8. The method according to claim 1, wherein said reloading instruction comprises a chain of reloading instructions.

9. The method according to claim 1, wherein said reloading instruction is a Load instruction.

10. The method according to claim 1, wherein said reloading instruction only manipulates an immediate operand.

11. The method according to claim 1, further comprising the step of dividing said stream into segments, wherein said step of including a reloading instruction is performed only in selected ones of said segments.

12. A computer software product, comprising a computer-readable medium in which computer program instructions are stored, which instructions, when read by a computer, cause the computer to perform a method of verifying an architecture of a processor, comprising the steps of:
    generating a stream of instructions for said processor, for verification of said design thereof responsively to an execution of said instructions, said stream including a client instruction that is accessible to said processor;
    preemptively including a reloading instruction in said stream upstream from said client instruction, said reloading instruction referencing a slave resource, wherein a value needed to condition said slave resource in order to satisfy a constraint of said client instruction is unknown prior to generation of said client instruction; and
    determining an initialization value for said slave resource while generating said client instruction, wherein an execution of said reloading instruction by said processor conditions said slave resource so as to satisfy said constraint of said client instruction, said reloading instruction being separated in said stream from said client instruction by at least one other of said instructions.

13. The computer software product according to claim 12, wherein said reloading instruction operates on said slave resource and a reloaded resource, wherein said reloaded resource is an operand of said client instruction.

14. The computer software product according to claim 13, wherein said slave resource is a memory location and said reloaded resource is a register.

15. The computer software product according to claim 13, wherein said step of including a reloading instruction further comprises the steps of:
    establishing a mapping between said reloaded resource and said slave resource;
    adding said mapping to a list of available mappings, members of said list of available mappings having a previously used reloaded resource and a previously used slave resource;
    locating one of said members wherein said previously used slave resource thereof and said previously used reloaded resource thereof conform to a present requirement;
    changing an initialization value of said previously used slave resource of said one member to a presently required value;
    changing a current value of said previously used reloaded resource of said one member to said presently required value;
    changing a current value of said previously used slave resource of said one member to said presently required value;
    assigning said previously used slave resource as said slave resource; and
    assigning said previously used reloaded resource as said reloaded resource.

16. The computer software product according to claim 15, further comprising the step of removing said one member from said list of available mappings.

17. The computer software product according to claim 15, further comprising the steps of prior to performing said step of including a reloading instruction:
    inspecting said stream to identify a candidate instruction for service as said reloading instruction, said candidate instruction having a source and a target;
    establishing a candidate mapping between said source and said target; and
    adding said candidate mapping to said list of available mappings.

18. The computer software product according to claim 15, wherein said mapping is a non-identity mapping.

19. The computer software product according to claim 12, wherein said reloading instruction comprises a chain of reloading instructions.

20. The computer software product according to claim 12, wherein said reloading instruction is a Load instruction.

21. The computer software product according to claim 12, wherein said reloading instruction only manipulates an immediate operand.

22. The computer software product according to claim 12, further comprising the step of dividing said stream into segments, wherein said step of including a reloading instruction is performed only in selected ones of said segments.

23. A verification system for verifying an architecture of a processor, comprising:
  a test generator for generating a stream of instructions that can be executed by said processor, for verification of said design thereof responsively to an execution of said instructions, said stream including a client instruction, said test generator having a reloading module that is adapted to preemptively include a reloading instruction in said stream upstream from said client instruction said reloading instruction referencing a slave resource, wherein a value needed to condition said slave resource in order to satisfy a constraint of said client instruction is unknown prior to generation of said client instruction, said reloading instruction being separated in said stream from said client instruction by at least one other of said instructions, said test generator being operative to determine an initialization value for said slave resource while generating said client instruction; and
  an execution facility for executing said instructions on said processor, wherein execution of said reloading instruction by said processor conditions a reloaded resource so as to satisfy said constraint of said client instruction.

24. The verification system according to claim 23, wherein said reloaded resource is an operand of said client instruction.

25. The verification system according to claim 24, wherein said slave resource is a memory location and said reloaded resource is a register.

26. The verification system according to claim 24, wherein said test generator includes:
  a first program for establishing a mapping between said reloaded resource and said slave resource and adding said mapping to a list of available mappings, members of said list of available mappings having a previously used reloaded resource and a previously used slave resource;
  a second program for locating one of said members wherein said previously used slave resource thereof and said previously used reloaded resource thereof conform to a present requirement; and
  a third program for changing an initialization value of said previously used slave resource of said one member to a presently required value, and for changing a current value of said previously used reloaded resource of said one member to said presently required value, and for changing a current value of said previously used slave resource of said one member to said presently required value.

27. The verification system according to claim 26, wherein said test generator further comprises a fourth program for removing said one member from said list of available mappings.

28. The verification system according to claim 26, further comprising a fifth program for inspecting said stream to identify a candidate instruction for service as said reloading instruction, said candidate instruction having a source and a target, establishing a candidate mapping between said source and said target, and adding said candidate mapping to said list of available mappings.

29. The verification system according to claim 26, wherein said mapping is a non-identity mapping.

30. The verification system according to claim 23, wherein said reloading instruction comprises a chain of reloading instructions.

31. The verification system according to claim 23, wherein said reloading instruction is a Load instruction.

32. The verification system according to claim 23, wherein said reloading instruction only manipulates an immediate operand.

33. The verification system according to claim 23, wherein said reloading instruction comprises a plurality of reloading instructions and said test generator further comprises a sixth program for dividing said stream into segments, wherein said test generator includes said reloading instructions only in selected ones of said segments.

34. The method according to claim 1, wherein said reloading instruction only manipulates a register.

35. The method according to claim 1, wherein said reloading instruction conditions a register by a value of an immediate field.

36. The method according to claim 2, wherein said step of including a reloading instruction further comprises the steps of:
  establishing a mapping between said reloaded resource and said slave resource;
  adding said mapping to a list of available mappings, members of said list of available mappings having a previously used reloaded resource and a previously used slave resource;
  identifying a subsequent access of said slave resource by another instruction; and
  responsively to said step of identifying, removing said mapping from said list of available mappings.

37. The computer software product according to claim 12, wherein said reloading instruction only manipulates a register.

38. The computer software product according to claim 12, wherein said reloading instruction conditions a register by a value of an immediate field.

39. The verification system according to claim 23, wherein said reloading instruction only manipulates a register.

40. The verification system according to claim 23, wherein said reloading instruction conditions a register by a value of an immediate field.

* * * * *